United States Patent [19]

Gehring

[11] Patent Number: 4,893,341
[45] Date of Patent: Jan. 9, 1990

[54] DIGITAL RECEIVER OPERATING AT SUB-NYQUIST SAMPLING RATE

[75] Inventor: Mark R. Gehring, Portland, Oreg.

[73] Assignee: AT&E Corporation, San Francisco, Calif.

[21] Appl. No.: 388,186

[22] Filed: Aug. 1, 1989

[51] Int. Cl.⁴ ............................................... H04H 5/00
[52] U.S. Cl. .......................................... 381/7; 329/356; 329/361; 331/23
[58] Field of Search ................. 329/356, 361; 331/20, 331/23, 25; 381/7; 358/144

[56] References Cited

U.S. PATENT DOCUMENTS 4,688,253  8/1987  Gumm ..................................... 381/7
4,757,538  7/1988  Zink ........................................ 381/7

Primary Examiner—Forester W. Isen
Attorney, Agent, or Firm—Klarquist, Sparkman, Campbell, Leigh & Whinston

[57] ABSTRACT

A digital receiver samples data from an amplitude modulated subcarrier at a rate less than twice the subcarrier's maximum frequency by sampling at known phase points. Sampling at known phase points is achieved by generating a sampling clock from a signal phase locked to and transmitted with the modulated data subcarrier.

4 Claims, 1 Drawing Sheet

DIGITAL RECEIVER OPERATING AT SUB-NYQUIST SAMPLING RATE

FIELD OF THE INVENTION

The present invention relates to digital data receivers, and more particularly relates to digital receivers that can digitally recover data by sampling at sub-Nyquist sampling rates.

BACKGROUND AND SUMMARY OF THE INVENTION

For expository convenience, the present invention is described with reference to one particular application thereof, namely a system for recovering digital subcarrier data from a conventional FM broadcast signal. It should be recognized, however, that the invention is not so limited.

Subcarriers on FM broadcast signals are increasingly being used to transmit digital data to subscribers of subcarrier data services. Data being transmitted by such services includes stock market reports and paging information. A subcarrier-based paging system is disclosed in U.S. Pat. No. 4,713,808 to Gaskill, the disclosure of which is incorporated herein by reference.

It is well known that a continuous signal must be sampled at a frequency above the Nyquist rate if the signal is to be properly characterized. (The Nyquist rate is defined as twice the signal's highest frequency.) If a sub-Nyquist rate is used, frequency aliasing results, causing various portions of the signal's spectrum to interfere with each other. If this interference is uncontrolled, the signal can be lost or scrambled. That is, the sampled data may correspond to two or more different input signals. To avoid this possibility, most digital systems sample at rates well in excess of the Nyquist rate.

In many applications, it is desirable to sample a signal at less than the Nyquist rate. By so doing, the system's cost and power consumption are reduced, and its hardware complexity is simplified. One such application is the paging system described in the Gaskill patent referenced above, in which the receiver is implemented in wristwatch form.

In the modulation system originally described in the Gaskill patent, the sampling problem was avoided by using phase shift keying. The data modulating the subcarrier was recovered at the wristwatch receiver by noting whether the subcarrier was in phase or out of phase with the pilot signal. This detection of the subcarrier phase was performed at a 19 KHz rate.

While the phase shift keying method was advantageous in certain respects, it required a subcarrier bandwidth of 38 KHz to achieve a 19 Kbit transmission rate—an inefficient use of spectrum. Modulation of the subcarrier using amplitude modulation would have permitted more efficient use of the spectrum, but would have required sampling at a rate in excess of the Nyquist criteria—a feat difficult to achieve given the constraints associated with the wristwatch design.

To permit use of an amplitude modulated subcarrier in the Gaskill system, it is an object of the present invention to circumvent the Nyquist sampling criteria. More particularly, it is an object of the present invention to permit a digital receiver to sample an amplitude modulated subcarrier at sub-Nyquist rates in a manner that controls the frequency aliasing such that the aliasing produces a constructive interference between the upper and lower sidebands.

Briefly, this object is achieved in the present invention by sampling the amplitude modulated subcarrier synchronously to its carrier. By sampling the signal at the times when the subcarrier is at its peak values, the data signal can be recovered at less than the Nyquist rate. Sampling is synchronized to the subcarrier by generating a sampling clock from a synchronizing signal transmitted with the modulated carrier that is phase locked thereto.

The foregoing and additional objects, features and advantages of the present invention will be more readily apparent from the following detailed description thereof, which proceeds with reference to the accompanying drawings.

DETAILED DESCRIPTION

Figure 1:
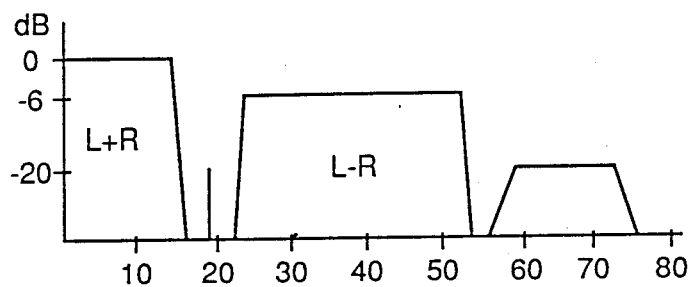
FIG. 1 is a diagram showing the composite baseband spectrum of an FM broadcast signal that includes an amplitude modulated subcarrier.

Reviewing briefly, a typical FM signal is composed of several components, as shown in FIG. 1. Principal among these are the audio subbands. The left plus right channel audio is broadcast in a first subband extending from 0 to about 15 KHz. The left minus right channel audio is broadcast in a second subband extending from about 23 to 53 KHz. Between these two audio bands is a stereo pilot signal at 19 KHz.

Subcarrier data is typically transmitted in the portion of the spectrum above 53 KHz. In the illustrated embodiment, the subcarrier is at 66.5 KHz and is amplitude modulated with 19 KHz data. This 19 KHz modulation spreads the subcarrier signal from 57 to 76 KHz.

As illustrated in FIG. 1, the majority of the signal power is concentrated in the audio subbands. The subcarrier typically represents one percent or less of the transmitted power.

Figure 2:
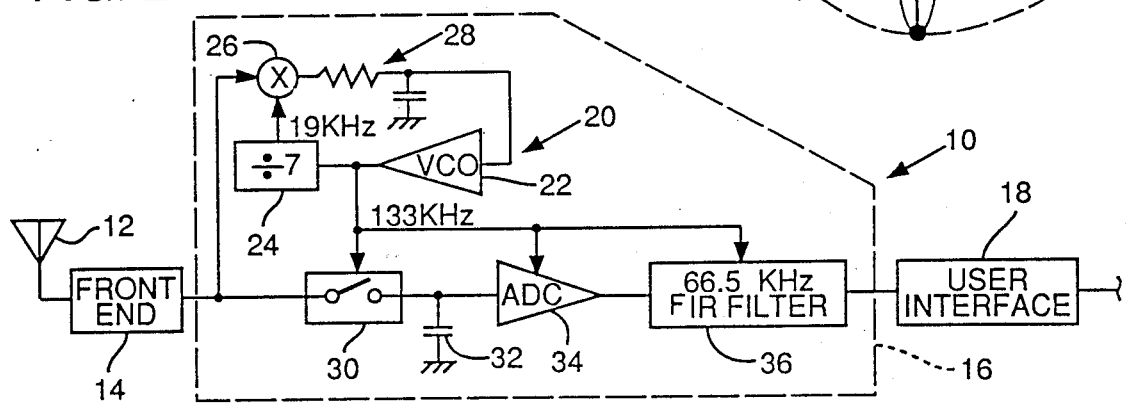
FIG. 2 is a schematic block diagram of a subcarrier data receiver according to one embodiment of the present invention.

Referring now to FIG. 2, an illustrative data receiver 10 according to the present invention includes an antenna 12, a front end 14 and a data decoder 16. The antenna 12 receives RF FM broadcast signals and provides them to the front end 14. The front end 14 converts these signals to baseband and provides the baseband signal spectrum to the data decoder 16. The data decoder recovers the data signals from the baseband spectrum and provides output signals corresponding thereto to a user interface 18.

In more detail, the data decoder 16 includes a frequency source 20 that generates a 133 KHz low duty cycle sampling clock signal which is phase locked to the 19 KHz stereo pilot signal. This phase locked frequency source 20 includes a voltage controlled oscillator 22, a frequency divider 24, a multiplier 26 and a low pass filter 28. The voltage controlled oscillator 22 operates nominally at 133 KHz. The frequency divider 24 divides the 133 KHz signal output from the oscillator by seven to yield a 19 KHz signal. This signal is mixed with the 19 KHz pilot signal from the composite FM signal by the mixer 26. The mixer output includes a low frequency difference term that represents a phase error between the voltage controlled oscillator output and the 19 KHz stereo pilot signal. This low frequency signal is filtered from all the other mixer products by the low pass filter 28 and is applied in a feedback loop back to the oscillator 22 to correct its frequency. The loop thus operates to lock the phase of the 133 KHz oscillator 22 to the phase of the stereo pilot signal.

At the FM transmitter, the 66.5 KHz subcarrier is itself generated from the 19 KHz stereo pilot by a phase locked frequency multiplier circuit. Consequently, the 133 KHz sampling clock produced by the frequency source 20 is phase locked to the 66.5 KHz subcarrier being decoded. The radio station also includes provision for adjusting the phase offset between the 19 KHz pilot signal and the 66.5 KHz subcarrier so that the receiver of the present invention samples at the peaks of the subcarrier waveform.

The 133 KHz sampling clock in the FIG. 2 embodiment is used to periodically trigger an analog sample and hold circuit 30, which operates in conjunction with an analog storage device, such as a capacitor 32. The sampled analog signal produced thereby is converted into digital form, again at the 133 KHz rate, by an analog-to-digital converter 34. These digital samples are applied to a 32 element finite impulse response digital filter 36 that passes the 66.5 KHz modulated subcarrier and attenuates the entertainment programming portions of the baseband FM spectrum. The resulting signal output from the filter 36 contains just the subcarrier portion of the baseband spectrum, sampled at a 133 KHz rate. This data is decoded and the resulting output signals applied to the user interface 18.

Conventional sampling theory dictates that a subcarrier centered at 66.5 KHz and extending up to 76 KHz must be sampled at a minimum frequency of 152 KHz (2×76 KHz) if the data therein is to be unambiguously recovered. More typical would be sampling at three times the highest frequency component, or 228 KHz. In the present invention, however, the lower sampling rate of 133 KHz can be used. This lower sample rate can be used in this instance because (a) the subcarrier modulation is symmetrical (i.e. double sideband); (b) the subcarrier is phase locked to the sampling clock; and (c) there are no signals present at multiples of N*133+66.5 KHz to be aliased into the subcarrier signal.

The double sideband modulation means the baseband signal takes the form:

$$V(t) = M(t) * \cos 2\pi F_0 t \quad (1)$$

where:
M(t) is the modulation signal;
$F_0$ is the carrier frequency; and
$\cos 2\pi F_0 t$ is the carrier signal waveform.

Figure 3:
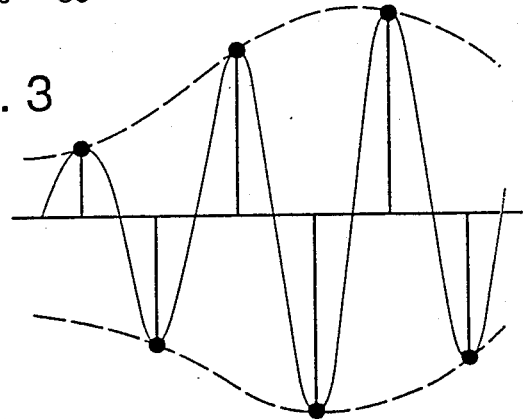
FIG. 3 is a diagram showing the sampling of a 66.5 KHz amplitude modulated subcarrier at a rate of 133 KHz according to one embodiment of the present invention.

Since these modulation and carrier terms are multiplied together, each zero crossing of the carrier signal forces a zero crossing in the composite baseband signal. Since the times of the zero crossings of the baseband signal are known, its maxima and minima can be accurately approximated as the points midway between the zero crossings. Since the sampling clock is phase locked to the subcarrier frequency, it can sample, reliably, at approximately these mid points. This sampling at known maxima and minima is graphically illustrated in FIG. 3. Since the signal maxima and minima can be accurately determined, the modulating signal can readily be recovered, despite non-compliance with the Nyquist criteria.

Figure 4:
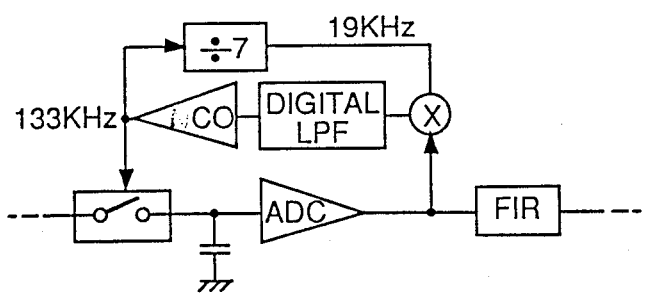
FIG. 4 is a schematic block diagram of a subcarrier data receiver according to another embodiment of the present invention.

FIG. 4 shows a portion of another form of the present invention in which the phase locking circuitry is implemented in digital form, using a numerically controlled oscillator, a digital low pass filter, etc.

Having described and illustrated the principles of our invention with reference to a detailed description thereof, it will be apparent that the invention can be modified in arrangement and detail without departing from such principles. Accordingly, we claim as our invention all such embodiments as may come within the scope and spirit of the following claims and equivalents thereto.

We claim:

1. A receiver for receiving an amplitude modulated subcarrier, said subcarrier being transmitted as part of an RF composite signal that includes a pilot signal, the receiver including:
   a front end for converting the RF composite signal to a baseband composite signal;
   a frequency source for producing a sampling clock signal;
   means for phase locking said frequency source to the pilot signal in the baseband composite signal;
   sampling means for sampling said composite signal at a rate determined by the sampling clock signal;
   analog to digital conversion means for converting the samples produced by the sampling means into digital form;
   digital filter means for digitally filtering said digitized samples to attenuate the non-subcarrier components thereof;
   wherein said sampling clock signal has a frequency less than twice the maximum frequency of the modulated subcarrier.

2. The receiver of claim 1 in which the frequency source includes means for producing a sampling clock signal having a frequency that is an integral multiple of the pilot signal frequency.

3. The receiver of claim 2 in which:
   the pilot signal has a frequency of 19 kilohertz;
   the subcarrier signal has a carrier frequency of 66.5 kilohertz; and
   the sampling clock signal has a frequency of 133 kilohertz.

4. A method of receiving data that is modulated on a subcarrier of a composite signal, the method comprising the steps:
   deriving from said composite signal a reference frequency having a known relationship with the subcarrier frequency;
   sampling the composite signal periodically at certain phase conditions of the reference frequency;
   digitizing the sampled composite signal to yield digital data; and
   filtering said digital data to attenuate the non-subcarrier components of the digitized composite signal;
   wherein said sampling occurs at a frequency twice the subcarrier frequency.

* * * * *